(12) United States Patent
Prince et al.

(10) Patent No.: US 7,271,045 B2
(45) Date of Patent: Sep. 18, 2007

(54) ETCH STOP AND HARD MASK FILM PROPERTY MATCHING TO ENABLE IMPROVED REPLACEMENT METAL GATE PROCESS

(75) Inventors: Matthew J. Prince, Portland, OR (US); Chris E. Barns, Portland, OR (US); Justin K. Brask, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/240,839

(22) Filed: Sep. 30, 2005

(65) Prior Publication Data

US 2007/0077765 A1   Apr. 5, 2007

(51) Int. Cl.
*H01L 21/8238* (2006.01)

(52) U.S. Cl. ............... 438/199; 438/202; 438/183; 438/926; 257/E21.632

(58) Field of Classification Search ........... 438/183, 438/926, 694, 199, 202
See application file for complete search history.

(56) References Cited

U.S. PATENT DOCUMENTS

| 6,346,450 B1* | 2/2002 | Deleonibus et al. ......... 438/305 |
| 2005/0148130 A1* | 7/2005 | Doczy et al. ............... 438/199 |
| 2006/0214241 A1* | 9/2006 | Pidin ......................... 257/407 |

* cited by examiner

*Primary Examiner*—Asok K. Sarkar
*Assistant Examiner*—Victor V. Yevsikov
(74) *Attorney, Agent, or Firm*—Blakely, Sokoloff, Taylor & Zafman LLP

(57) ABSTRACT

A method including forming a hard mask and an etch stop layer over a sacrificial material patterned as a gate electrode, wherein a material for the hard mask and a material for the etch stop layer are selected to have a similar stress property; removing the material for the hard mask and the material for the etch stop layer sufficient to expose the sacrificial material; replacing the sacrificial material with another material. A system including a computing device including a microprocessor, the microprocessor including a plurality of transistor devices, at least one of the plurality of transistor devices including a gate electrode formed on a substrate surface; a discontinuous etch stop layer conformally formed on the substrate surface and adjacent side wall surfaces of the gate electrode; and a dielectric material conformally formed over the etch stop layer.

13 Claims, 3 Drawing Sheets

ETCH STOP AND HARD MASK FILM PROPERTY MATCHING TO ENABLE IMPROVED REPLACEMENT METAL GATE PROCESS

FIELD

Integrated Circuit Structures.

BACKGROUND

The use of metal gate technology is viewed as very desirable for complementary metal oxide semiconductor (CMOS) device technology scaling below the sub 0.1 micron regime. Replacing traditional polycrystalline silicon ("polysilicon") gate electrodes with metal or metal alloy gate electrodes can significantly eliminate undesired voltage drops associated with polysilicon gate electrodes (e.g., polysilicon depletion effect) and improve device drive current performance. Metal and metal alloy gate electrodes can also reduce the parasitic resistance of the gate line and allow longer gate runners in high performance integrated circuit design for applications such as stacked gates, wordlines, buffer drivers, etc.

Conductive materials have different energies measured conventionally by, their Fermi level. As an example, the Fermi level of a material determines its work function. The intrinsic Fermi level of an undoped semiconductor is at the middle of the bandgap between the conduction and valence band edges. In an N-type doped silicon, the Fermi level is closer to the conduction band than to the valence band (e.g., about 4.15 electron-volts). In a P-type doped silicon, the Fermi level is closer to the valence band than the conduction band (e.g., about 5.2 electron-volts).

Metals or their compounds have been identified that have work functions similar to the work functions of a conventional P-type doped semiconductor substrate. Other metals or their compounds have been identified that have work functions similar to a conventional N-type doped semiconductor substrate. Examples of metals that have a work function similar to P-type doped semiconductor material, include but are not limited to, nickel (Ni), ruthenium oxide (RuO), molybdenum nitride (MoN), and tantalum nitride (TaN). Examples of metals that have a work function similar to N-type doped semiconductor material, include but are not limited to, ruthenium (Ru), zirconium (Zr), niobium (Nb), tantalum (Ta), molybdenum silicide (MoSi), and tantalum silicide (TaSi).

BRIEF DESCRIPTION OF THE DRAWINGS

Features, aspects, and advantages of embodiments will become more thoroughly apparent from the following detailed description, appended claims, and accompanying drawings in which:

DETAILED DESCRIPTION

FIGS. 1-6 illustrate an embodiment of a method of forming a metal oxide semiconductor (MOS) device utilizing metal gate electrode technology. The method forms metal gate electrodes through a process employing a sacrificial gate electrode (such as polysilicon) to form the basic structure then removing the sacrificial gate electrode and replacing it with a different material, such as a metal. The technique may be used in various circuit structures including a complementary metal oxide semiconductor (CMOS).

Figure 1:
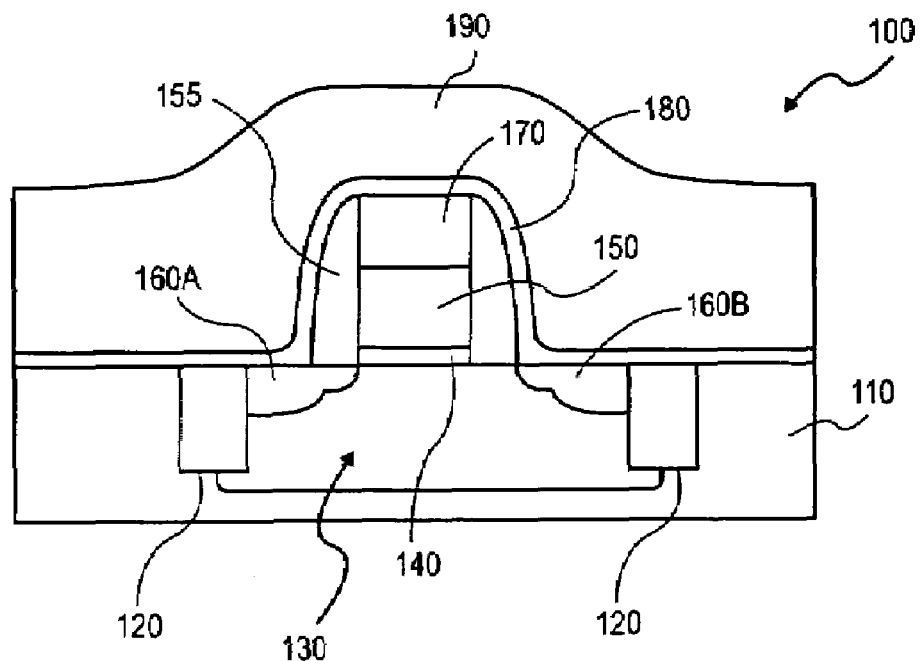
FIG. 1 shows a cross-sectional side view of a portion of an integrated circuit structure including a substrate having a transistor device formed thereon with a hard mask over a sacrificial gate electrode, an etch stop layer over the gate electrode and hard mask, and a dielectric layer over the etch stop layer.

FIG. 1 shows a cross-sectional side view of structure 100 that includes substrate 110 such as a semiconductor (e.g., silicon) substrate having shallow trench isolation structure 120 formed in substrate 110. In this embodiment, shallow trench isolation structures 120 define regions or areas for individual transistor devices. FIG. 1 also shows well 130 in a region of the substrate defined by shallow trench isolation structures 120. For example, a P-type well may be formed by introducing a dopant, such as boron into a substrate. An N-type well may be formed by introducing a dopant such as arsenic, phosphorous, or antimony into the substrate. The dopant of a particular well will depend on the desired device type (N-type, P-type). The practice of forming shallow trench isolation structures 120 and well 130 are known in the art and are not presented herein.

FIG. 1 also shows gate dielectric 140 formed on a surface of substrate 110 (an upper surface as viewed). Gate dielectric 140 may be grown or deposited. An example of a gate dielectric that is typically grown by thermal techniques over substrate 110 of silicon is silicon dioxide ($SiO_2$). It is to be appreciated that other gate dielectrics may also be used to further optimize NMOS and PMOS devices. For example, gate dielectrics having a high dielectric constant design may be utilized in an appropriate manner. At this stage, gate dielectric 140 may be formed as a blanket over a surface of a substrate. After gate dielectric 140 is formed, a material for a sacrificial gate electrode structure is deposited over the substrate. For a sacrificial material such as polysilicon, the polysilicon may be deposited by, for example, chemical vapor deposition as a blanket over the substrate. In a representative example, according to current device size technologies, the sacrificial material is formed to a thickness on the order of 800 to 2000 angstroms. In another embodiment, a sacrificial material as gate dielectric 140 is also employed (e.g., 15 to 40 angstroms thick) that may be removed at a layer point (as will become clear in the following discussion).

Following the deposition of a sacrificial material such as polysilicon over the substrate, hard mask 170 may be patterned over the sacrificial material to define length and width dimensions of a gate electrode. The blanket deposited sacrificial material may then be etched away leaving only sacrificial material under hard mask 170. FIG. 1 shows hard mask 170 over sacrificial gate electrode 150 of, for example, a polysilicon material. In one embodiment, hard mask 170 is retained at this point to protect sacrificial gate electrode 150 from subsequent processing, such as a deposition of a metal, such as nickel, to form silicide in junction regions. Nickel, for example, introduced into a polysilicon material for sacrificial gate electrode 150 will tend to make the removal of polysilicon by wet chemical etch more difficult.

Following the patterning of sacrificial gate electrode 150, sidewall spacers 155 are optionally formed (e.g., deposited on opposing sides of sacrificial gate electrode 150). In one embodiment, side wall spacers 155 serve to align junction regions away from the gate electrode. Following the formation of side wall spacers 155, junction region 160A and junction region 160B may be formed in substrate 110 as source and drain region, respectively. The introduction of a dopant to form junction region 160A and junction region 160B forms the junctions adjacent side wall spacers 155 and away from the gate electrode. Additional tip or halo implants may also be introduced. Junction region 160A and junction region 160B may be formed by introducing a dopant into a semiconductor material such as silicon. Following the introduction of a dopant, a silicide may be formed in each junction region by the introduction of a metal, such as nickel.

Following the formation of junction region 160A and junction region 160B, etch stop layer 180 is formed as a blanket over a surface of substrate 110 including around sidewall spacers 155 and over gate electrode 150 and hard mask 170. In one embodiment, etch stop layer 180 is a silicon nitride material deposited to a thickness on the order of 100 to 500 angstroms. In addition, a stress (compressive to tensile) of a material for etch stop layer 180 and a stress of a material for hard mask 170 are matched so that, for example, each is compressive or each is tensile. This is in contrast to the prior art which taught different stresses between a hard mask and an etch stop layer even of similar materials. Thus, in one embodiment, hard mask 170 and etch stop layer 180 are each silicon nitride having a compressive stress on the order of two to 10 percent. Alternatively, each of hard mask 170 and etch stop layer 180 is tensile and hard mask 170 is silicon nitride and etch stop layer 180 is silicon carbide.

Overlying etch stop layer 180 in FIG. 1 is a pre-metal dielectric layer (ILD0) blanketed over etch stop layer 180, hard mask 170 and gate electrode 150. A representative thickness is on the order of 3000 to 6000 angstroms.

Figure 2:
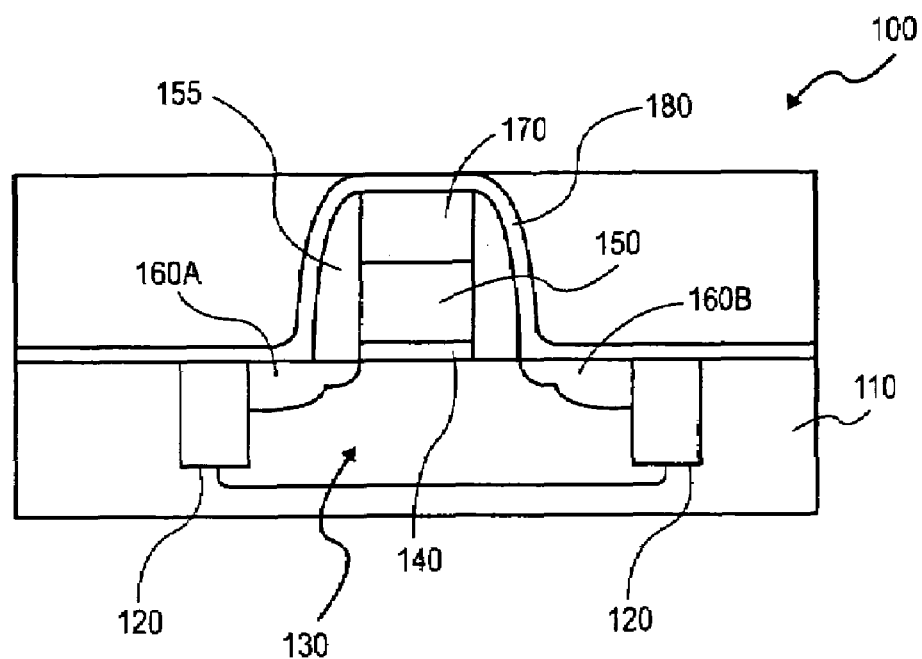
FIG. 2 shows the structure of FIG. 1 following the exposure of the etch stop layer.

FIG. 2 shows the structure of FIG. 1 following the exposure of etch stop layer 180 through ILD0190. Representatively, a material for ILD0may be removed such as by chemical-mechanical polishing. The polishing can be completed using a silica-based particle slurry in basic pH 10-11, with five pounds per square inch (psi) down-force and 50 revolutions per minute (rpm) platen rotation on a polyurethane polish pad to selectively polish oxide over silicon nitride in the example where ILD0190 is an oxide and etch stop layer 180 is a silicon nitride.

Figure 3:
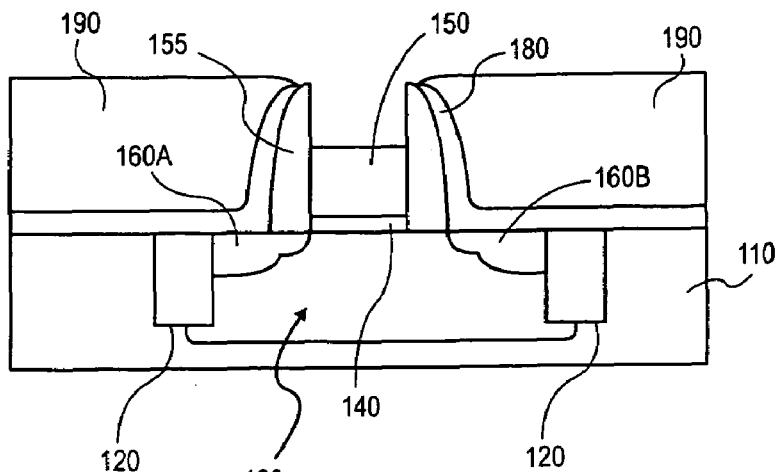
FIG. 3 shows the structure of FIG. 1 following the exposure of the gate electrode.

FIG. 3 shows the structure of FIG. 2 following the removal of an exposed portion of etch stop layer 180 and hard mask 170. In the embodiment where the stress of etch stop layer 180 and hard mask 170 are matched to be, for example, each compressive, the material of each may be removed using wet chemical etch processing. The matching stress property tends to translate to similar removal rates and avoid undesirable topography notches. Representatively, where each are compressive silicon nitride material, a wet etch chemistry of phosphoric acid heated to 150-170 degrees Celsius and at a concentration of 75-95% in water may be used to remove exposed portions of etch stop layer 180 and hard mask 170.

Figure 4:
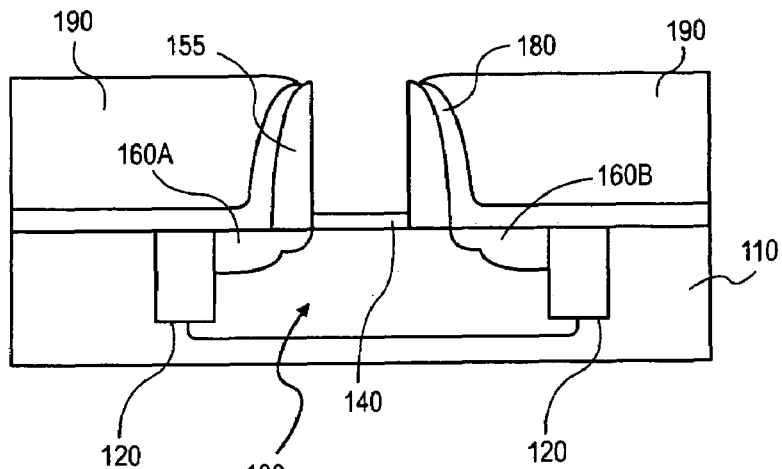
FIG. 4 shows the structure of FIG. 1 following the removal of the gate electrode.

FIG. 4 shows the structure of FIG. 3 following the removal of a material for sacrificial gate electrode 150. An embodiment where sacrificial gate electrode 150 is polysilicon, the polysilicon may be removed by a wet chemical etch, such as tetramethylammonium hydroxide heated to 70-90 degrees Celsius and at a concentration of 20-30% in water. At this point, if a sacrificial material was employed as gate dielectric 140 was employed, the sacrificial gate dielectric may also be removed. In such case, once removed, a gate dielectric material of, for example, a high k material may be introduced, on a surface of substrate 110.

Figure 5:
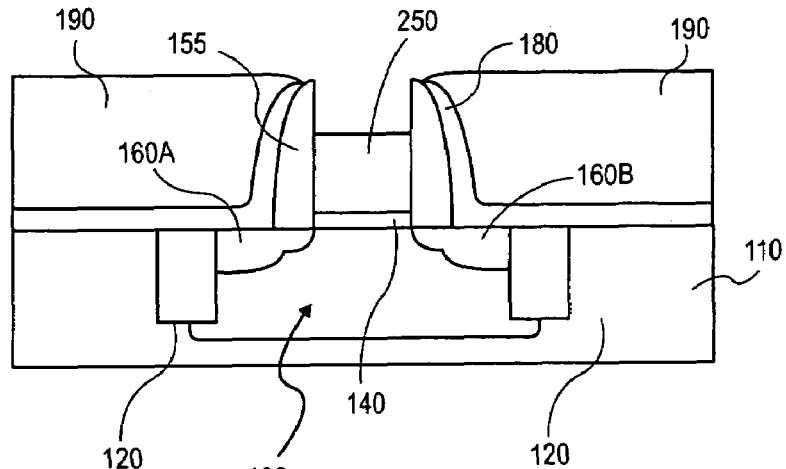
FIG. 5 shows the structure of FIG. 1 following the addition of a gate electrode of another material.

FIG. 5 shows the structure of FIG. 4 following the introduction of gate electrode material 250. Gate electrode material 250 is introduced in the opening or by the removal of sacrificial gate electrode 150. In one embodiment, gate electrode 250 is a material selected from an N-type metal material or a P-type metal material deposited to a desired gate electrode thickness suitable for an integrated circuit device characteristic. By describing the metal material as either N-type or P-type, is meant that the metal has a work function corresponding to either an NMOS or a PMOS device. For example, the work function of the metal material is close to that of a corresponding Fermi level of N-type doped polysilicon (e.g., about 4.15 electron-volts) or P-type doped polysilicon (e.g., about 5.2 electron-volts). The metal material may exist at the desired work function in its natural state or by chemical reaction, alloying, doping, etc. Examples of metal materials that have a work function similar to an N-type doped semiconductor material include, but are not limited, ruthenium (Ru), zirconium (Zr), niobium (Nb), Tantalum (Ta), and titanium silicide ($TiSi_2$). Examples of metal materials that have a work function similar to a P-type doped semiconductor material include, but are not limited, nickel (Ni), ruthenium oxide (RuO), and molybdenum nitride (MoN). In a representative embodiment according to current technologies, a metal material may be deposited to a thickness on the order of 50 to 2000 angstroms.

Figure 6:
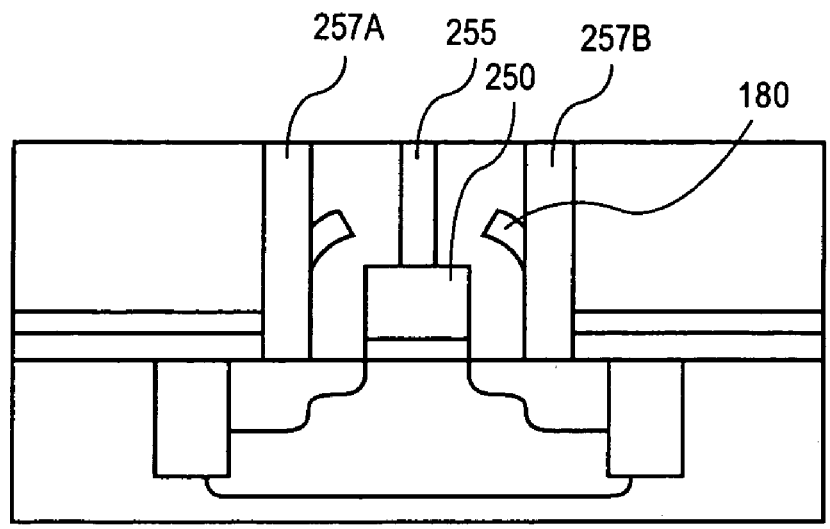
FIG. 6 shows the structure of FIG. 5 following the insulation of the gate electrode and the formation of contacts to the gate electrode and the junction regions.

Following the formation of gate electrode 250, a dielectric layer may be introduced over the structure, planarized and contact formed to the junction region and gate electrode 250. FIG. 6 shows the structure of FIG. 5 following the insulation of gate electrode 250 with a dielectric material such as an oxide and contact 255 formed to gate electrode 250 and contact 257A and contact 257B formed to junction regions 160A and 160B, respectively. In this view, etch stop layer 180 is conformally formed on a surface of substrate 110 and adjacent side walls spacers 155. Etch stop layer 180 is discontinuous through an area defined at least in part by a dimension of gate electrode material 250.

Figure 7:
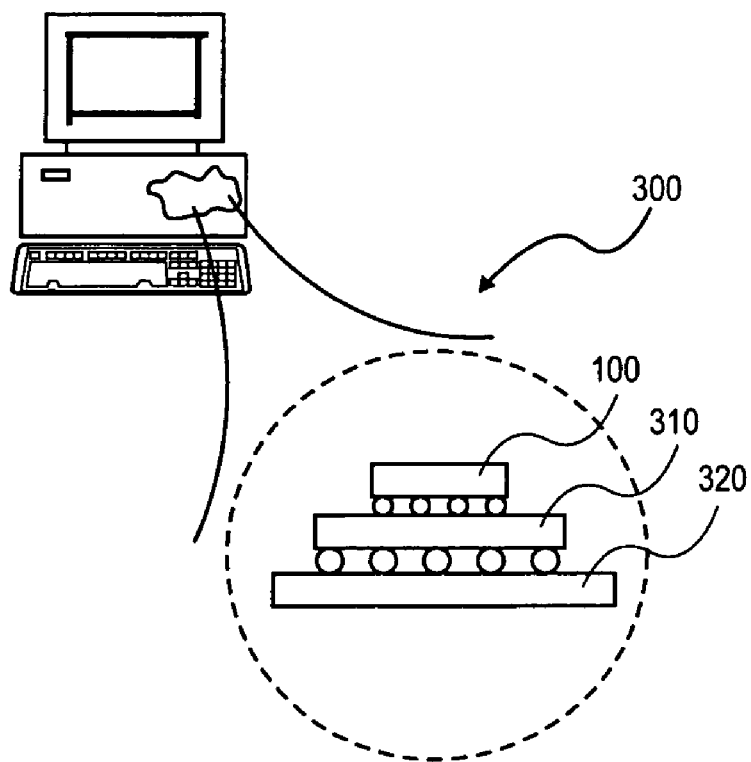
FIG. 7 shows a computer system including a microprocessor having transistors formed according to an embodiment shown in FIGS. 1-6.

FIG. 7 shows a cross-sectional side view of an integrated circuit package that can be physically and electrically connected to a printed wiring board or printed circuit board (PCB) to form an electronic assembly. The electronic assembly can be part of an electronic system such as a computer (e.g., desktop, laptop, handheld, server, etc.), wireless communication device (e.g., cellular phone, cordless phone, pager, etc.), computer-related peripheral (e.g., printer, scanner, monitor, etc.), entertainment device (e.g., television, radio, stereo, tape and compact disc player, video cassette recorder, MP3 (motion picture experts group, audio layer 3 player, etc.), and the like. FIG. 7 illustrates the packet is part of a desktop computer. FIG. 7 shows electronic assembly 300 including die 100 physically and electrically connected to packet substrate 310. Die 100 is an integrated circuit die, such as a microprocessor die having transistor structures formed as described with reference to FIGS. 1-6. Electrical contact points (e.g., contact pad on a surface of die 100) are connected to packet substrate 310 through, for example, a conductive bump layer. Packet substrate 310 may be used to connect die 110 to printed circuit board 320, such as a motherboard or other circuit board.

In the preceding detailed description, reference is made to specific embodiments thereof. It will, however, be evident that various modifications and changes may be made thereto without departing from the broader spirit and scope of the following claims. The specification and drawings are, accordingly, to be regarded in an illustrative rather than a restrictive sense.

What is claimed is:

1. A method comprising:
    forming a hard mask and an etch stop layer over a sacrificial material patterned as a gate electrode, wherein a material for the hard mask and a material for the etch stop layer are selected such that a stress property of each material is similar;
    removing the material for the hard mask and the material for the etch stop layer sufficient to expose the sacrificial material;
    replacing the sacrificial material with another material.

2. The method of claim 1, wherein the stress property is compressive.

3. The method of claim 1, wherein the etch stop layer is compressive silicon nitride.

4. The method of claim 1, wherein the etch stop layer is silicon carbide.

5. The method of claim 1, wherein removing the material for the hard mask and the material for the etch stop layer comprises a wet etch chemistry.

6. A method comprising:
    forming a hard mask over a surface of a gate electrode on a substrate, the surface opposite a surface of the substrate;
    forming an etch stop layer over the hard mask, wherein a material for the etch stop layer and a material for the hard mask are selected such that a stress property of each material is similar;
    forming a dielectric material over the hard mask;
    exposing the etch stop layer on the hard mask by removing the dielectric material; and
    exposing the surface of the gate electrode by removing the etch stop layer and the hard mask.

7. The method of claim 6, wherein exposing the etch stop layer is accomplished by a first process of removal of material and exposing the surface of the gate electrode is accomplished by a second process of removal of material different than the first process.

8. The method of claim 7, wherein the first process is a chemical mechanical polishing process.

9. The method of claim 7, wherein the second process is an etch process.

10. The method of claim 9, wherein the etch process is a chemical etch that removes a material for the hard mask and a material for the etch stop layer at a similar rate.

11. The method of claim 6, wherein the stress property is compressive.

12. The method of claim 6, wherein forming the etch stop layer comprises conformally depositing the etch stop layer over the surface of the substrate and the hard mask.

13. A system comprising:
    a computing device comprising a microprocessor, the microprocessor comprising a plurality of transistor devices, at least one of the plurality of transistor devices comprising:
        a gate electrode formed on a substrate surface;
        an etch stop layer comprising silicon carbide conformally formed on the substrate surface and adjacent side wall surfaces of the gate electrode and being discontinuous over a surface of the gate electrode opposite the substrate surface; and
        a dielectric material conformally formed over the etch stop layer.

* * * * *